(12) United States Patent
Chen et al.

(10) Patent No.: US 6,559,074 B1
(45) Date of Patent: May 6, 2003

(54) METHOD OF FORMING A SILICON NITRIDE LAYER ON A SUBSTRATE

(75) Inventors: Steven A. Chen, San Jose, CA (US); Xianzhi Tao, Palo Alto, CA (US); Shulin Wang, Campbell, CA (US); Lee Luo, Fremont, CA (US); Kegang Huang, Fremont, CA (US); Sang H. Ahn, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/015,713

(22) Filed: Dec. 12, 2001

(51) Int. Cl.[7] .......................... H01L 21/31; H01L 23/58
(52) U.S. Cl. ...................... 438/791; 438/778; 438/958; 257/649
(58) Field of Search ................... 438/791, 792, 438/793, 794, 795, 60, 66; 257/640, 645, 649

(56) References Cited

U.S. PATENT DOCUMENTS 6,271,054 B1 * 8/2001 Ballantine et al. .......... 427/534
6,333,547 B1 * 12/2001 Tanaka et al. .............. 257/649

* cited by examiner

Primary Examiner—Carl Whitehead, Jr.
Assistant Examiner—David L. Hogans
(74) Attorney, Agent, or Firm—Blakely Sokoloff Taylor & Zafman

(57) ABSTRACT

A silicon nitride layer is formed over transistor gates while the processing temperature is relatively high, typically at least 500° C., and the pressure is relatively high, typically at least 50 Torr, to obtain a relatively high rate of formation of the silicon nitride layer. Processing conditions are controlled so as to more uniformly form the silicon nitride layer. Generally, the ratio of the $NH_3$ gas to the silicon-containing gas by volume is selected sufficiently high so that, should the surface have a low region between transistor gates which is less than 0.15 microns wide and have a height-to-width ratio of at least 1.0, as well as an entirely flat area of at least 5 microns by 5 microns, the layer forms at a rate of not more than 25% faster on the flat area than on a base of the low region.

14 Claims, 4 Drawing Sheets

METHOD OF FORMING A SILICON NITRIDE LAYER ON A SUBSTRATE

BACKGROUND OF THE INVENTION

1). Field of the Invention

This invention relates to a method of forming a silicon nitride layer on a substrate.

2). Discussion of Related Art

Integrated circuits are often formed in and on a semiconductor wafer substrate. One or more steps may include the formation of a silicon nitride layer on a surface of the wafer substrate. The surface of the wafer substrate often has alternating raised transistor gates and low regions between the transistor gates. Very narrow low regions may be formed between some of these formations, and the surface may also have entirely flat larger areas.

A mixture of silane ($SiH_4$) gas and ammonia ($NH_3$) gas is often used to form the silicon nitride layer over such a surface. The silicon nitride layer is subsequently etched back to form spacers adjacent to the transistor gates. The $SiH_4$ gas and the $NH_3$ gas are introduced into a processing chamber and react with one another to form silicon nitride, which deposits on the surface. The rate at which the silicon nitride layer forms depends on the processing conditions, in particular the pressure within the chamber. A higher pressure will result in a higher rate at which the silicon nitride layer forms. In one process, the pressure is maintained relatively low, but many wafers are simultaneously processed in one chamber so that a relatively high throughput can be maintained.

Should a single wafer be processed in a chamber, it may be required to increase the pressure to obtain a higher rate at which the silicon nitride layer forms. It has, however, been found that substantial variations in thickness result when a silicon nitride layer is formed at a high rate and pressure, in particular when comparing deposition rates, and corresponding resulting thicknesses, between larger flat areas and narrow low regions between transistor gates.

SUMMARY OF THE INVENTION

This invention relates generally to a method of forming a silicon nitride layer on a substrate. A substrate having a surface with raised transistor gates and low regions between the transistor gates is inserted into a processing chamber. The substrate is heated to a processing temperature. A pressure within the chamber is maintained at a processing pressure. A silicon-containing gas is introduced into the chamber. $NH_3$ gas is introduced into the chamber. The silicon-containing gas and the $NH_3$ gas react with one another to form a silicon nitride layer on the surface. The substrate is removed from the chamber when the silicon nitride layer is formed on the surface.

The silicon nitride layer is formed while the processing temperature is relatively high, typically at least 500° C., and the pressure is relatively high, typically at least 50 Torr, to obtain a relatively high rate of formation of the silicon nitride layer. Processing conditions are controlled so as to more uniformly form the silicon nitride layer. Generally, the ratio of the $NH_3$ gas to the silicon-containing gas by volume is selected sufficiently high so that, should the surface have a low region between transistor gates which is less than 0.15 microns wide and have a height-to-width ratio of at least 1.0, as well as an entirely flat area of at least 5 microns by 5 microns, the layer forms at a rate of not more than 25% faster on the flat area than on a base of the low region. The ratio is generally between 200 and 350, although a much lower ratio may be possible if other processing conditions, in particular pressure, are controlled, with similar results.

BRIEF DESCRIPTION OF THE DRAWINGS

The invention is further described by way of example with reference to the accompanying drawings, wherein.

DETAILED DESCRIPTION OF THE INVENTION

A process is described wherein a silicon nitride layer is formed over transistor gates while the processing temperature is relatively high, typically at least 500° C., and the pressure is relatively high, typically at least 50 Torr, to obtain a relatively high rate of formation of the silicon nitride layer. Processing conditions are controlled so as to more uniformly form the silicon nitride layer. Generally, the ratio of the $NH_3$ gas to the silicon-containing gas by volume is selected sufficiently high so that, should the surface have a low region between transistor gates which is less than 0.15 microns wide and have a height-to-width ratio of at least 1.0, as well as an entirely flat area of at least 5 microns by 5 microns, the layer forms at a rate of not more than 25% faster on the flat area than on a base of the low region.

Figure 1:
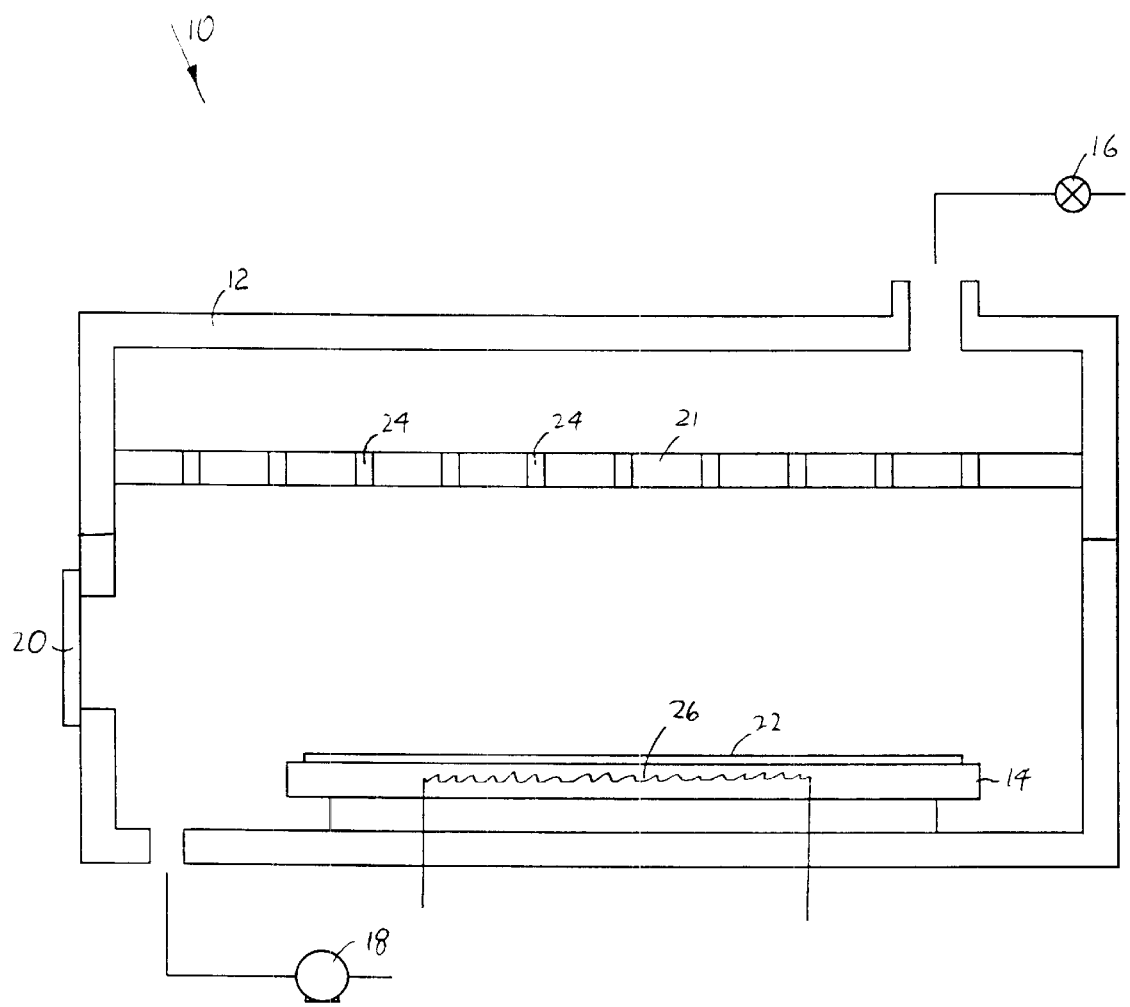
FIG. 1 is a cross-sectional side view of a processing chamber which may be used for carrying out the method according to invention.

FIG. 1 of the accompanying drawings illustrates an apparatus 10 which is used for carrying out the method according to the invention. The apparatus includes a chemical vapor deposition chamber 12, a susceptor 14, a valve 16, a pump 18, a slit valve 20, and a dispersion plate 21. The susceptor 14 is located in a base of the chamber 12. The valve 16 is connected to an upper part of the chamber 12 and the pump 18 is connected to a base of the chamber 12. The slit valve 20 opens and closes a slit valve opening in a side of the chamber 12. The dispersion plate 21 is located in a lid of the chamber 12 above the slit valve 20 and separates the chamber 12 into upper and lower portions.

In use, a wafer substrate 22 is inserted through the slit valve opening into the chamber 12 and located on the susceptor 14. The slit valve 20 then closes the slit valve opening. The valve 16 is closed and the pump 18 is switched on so that a pressure within the chamber 12 reduces. Gases are then introduced through the valve 16 into the chamber 12 and flow through openings 24 in the dispersion plate 21 over the wafer substrate 22 to the pump 18. The wafer substrate 22 is so exposed to the gases. The valve 16 is typically connected to a manifold which is connected to different gases. Different gases can thus be introduced into the chamber 12 at different times. The pump 18 can be operated to maintain and control the pressure within the chamber 12 at a predetermined selected processing pressure, or to increase or decrease the pressure. A resistive heating element 26 is located within the susceptor 14. A current through the resistive heating element 26 causes heating of the susceptor and the wafer substrate 22. An apparatus (not shown) is used to monitor the pressure within the chamber 12 and another apparatus (not shown) detects the temperature of the wafer substrate 22.

Figure 2:
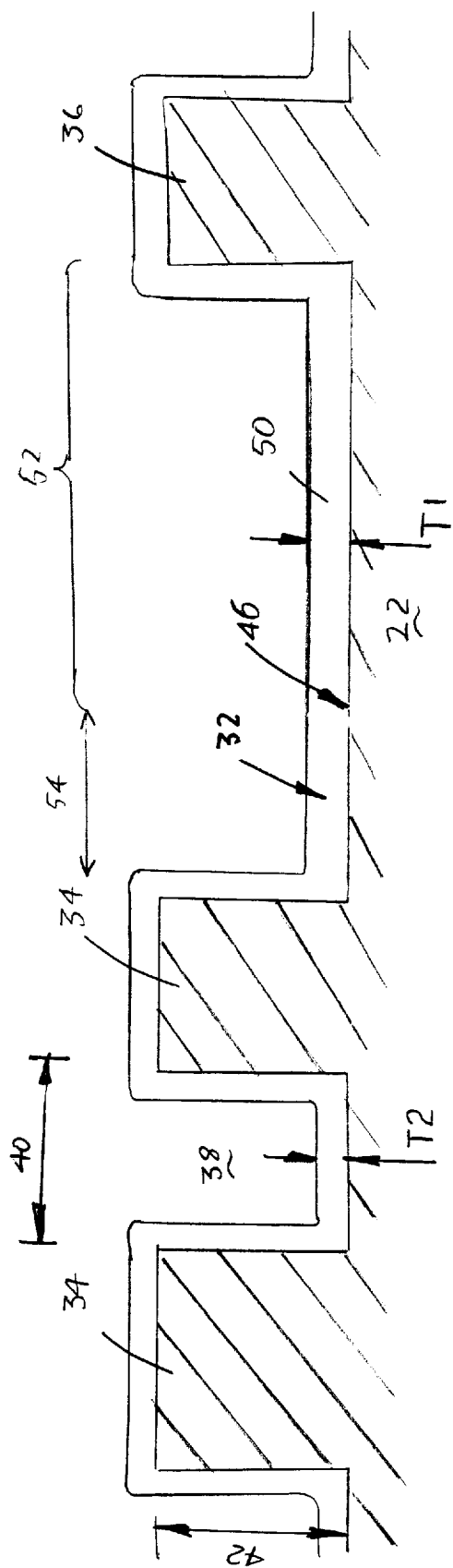
FIG. 2 is a cross-sectional side view of a wafer substrate on which a silicon nitride layer is formed according to the method of the invention.

FIG. 2 illustrates a wafer substrate 22 having an upper surface 32 onto which a silicon nitride layer has to be formed. The upper surface 32 has a plurality of raised transistor gates 34 and 36 with low regions between them. The transistor gates 34 and 36 are located close to one another in a dense region, and the transistor gates 36 are located further from one another in a less-dense region than the transistor gates 34. A low region 38 is formed between two of the transistor gates 34. The low region 38 has a width 40 and a depth 42. The width 40 is less than 0.15 microns, and a ratio of the depth 42 to the width 40 is at least 1.0. The low region 38 is thus relatively narrow, but has a depth which is relatively deep when compared to its width. An entirely flat area 46 is formed between the transistor gates 34 and 36. The area 46 is approximately 10 microns wide, and has a length into the paper of at approximately 20 microns. The area 46 is thus approximately 200 microns square.

Figure 3:
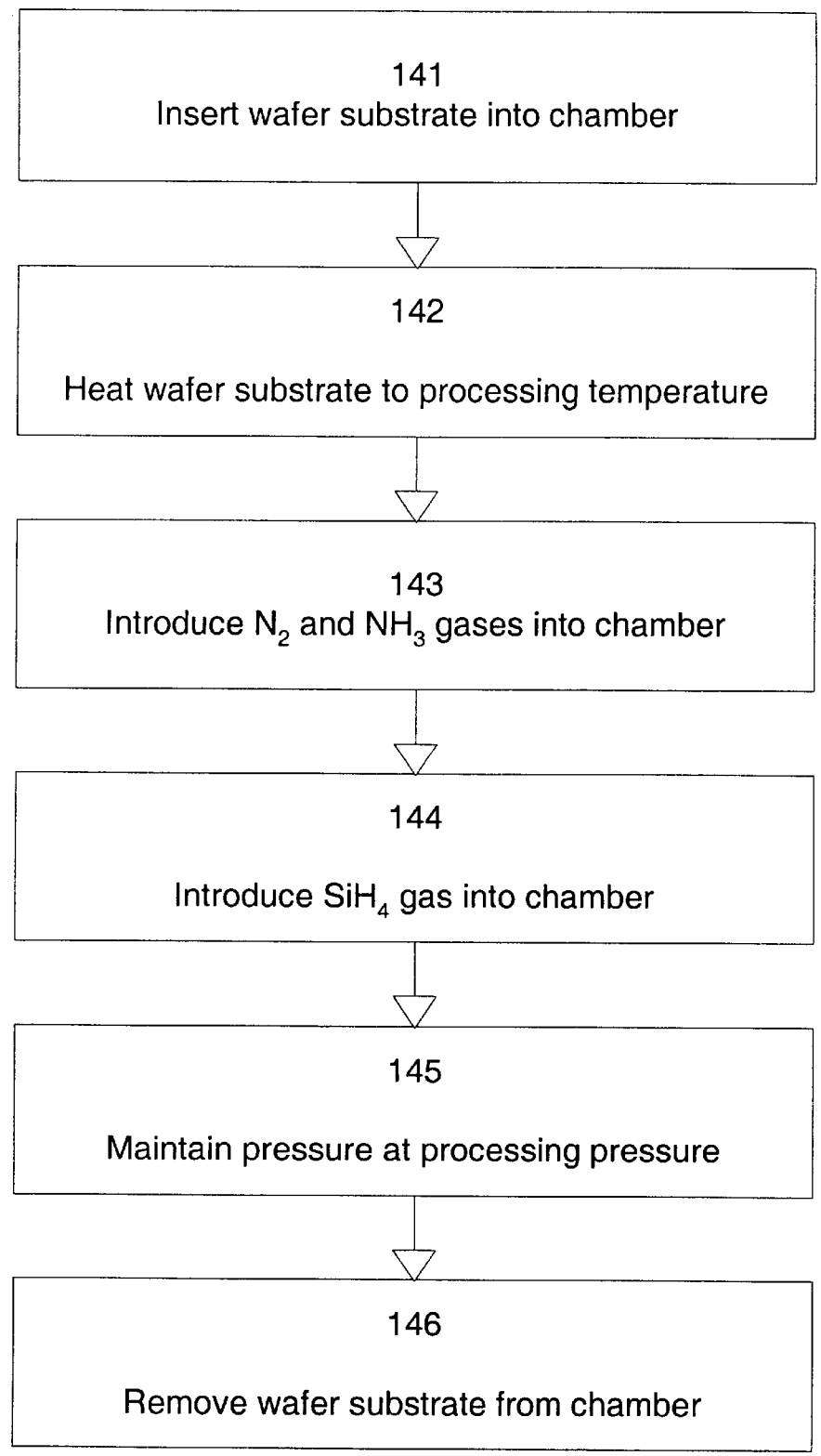
FIG. 3 is a flow chart illustrating the steps used to form a silicon nitride layer according to an embodiment of the invention.

FIG. 3 illustrates the steps that are carried out to form a silicon nitride layer on the surface 32 in FIG. 2. In step 141, the wafer substrate is inserted into the chamber. In step 142, the wafer substrate is then heated to a processing temperature. In step 143, $NH_3$ gas is introduced into the chamber, together with a nitrogen ($N_2$) carrier gas. In step 144, $SiH_4$ gas is introduced into the chamber. The $SiH_4$ gas and the $NH_3$ gas may be premixed before flowing into the chamber. In step 145, the pressure within the processing chamber is maintained at a processing pressure while the water is exposed to the gases. In step 146, the pressure is pumped down to approximately 2 Torr and the wafer substrate is removed from the chamber.

Figure 4:
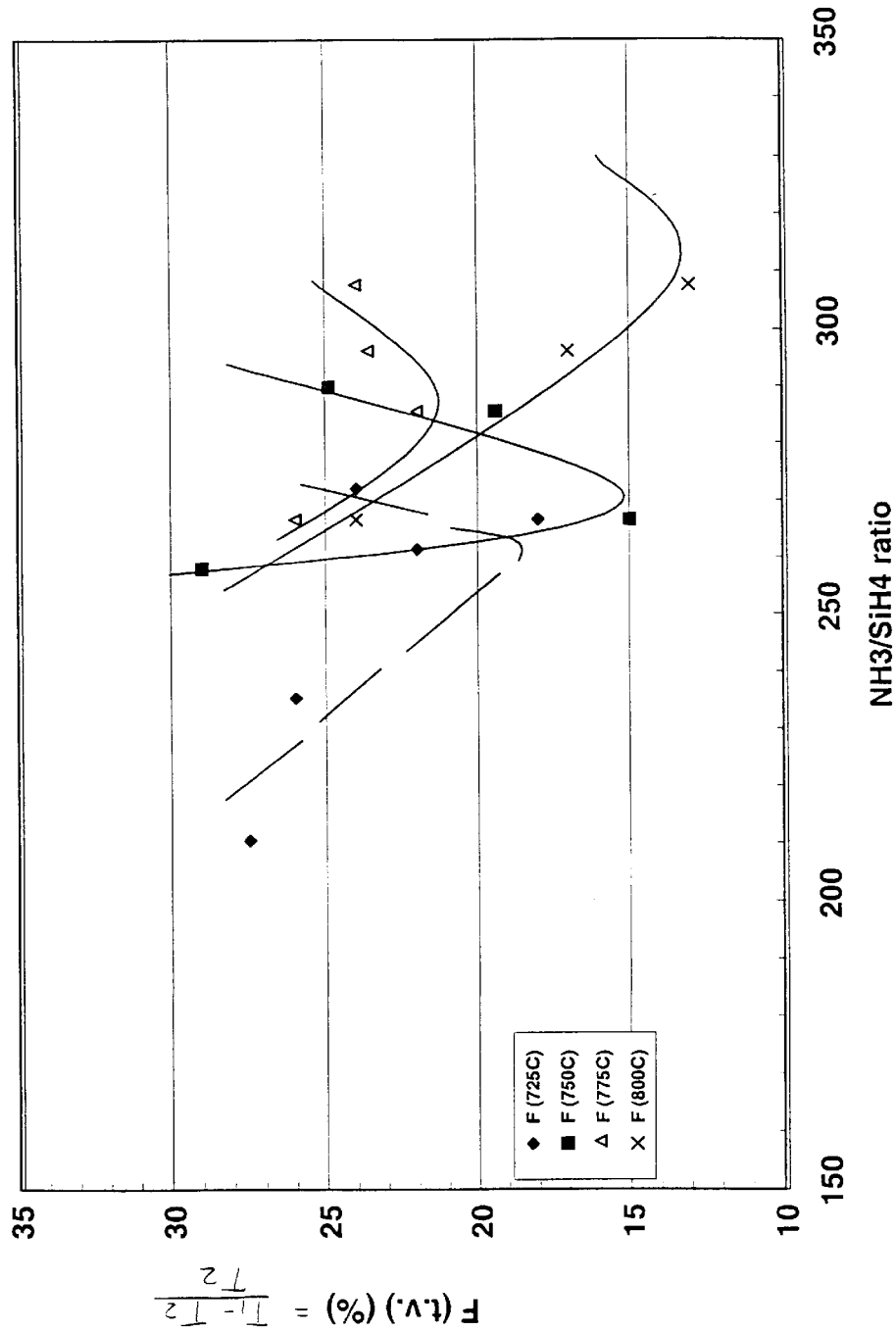
FIG. 4 is a chart illustrating thickness variation against processing partial pressure ratio of $NH_3$ gas and $SiH_4$ gas for sixteen different wafer substrates in four groups, the groups processed at different temperatures, and each group processed at four different partial pressure ratios of $NH_3$ gas and $SiH_4$ gas.

The $SiH_4$ gas and the $NH_3$ gas react with one another while the substrate in the processing chamber is at the processing temperature and the pressure within the chamber is at the processing pressure. As illustrated in FIG. 4, the reaction of the $SiH_4$ gas with the $NH_3$ gas causes the formation of a silicon nitride layer 50 on the surface 32 of the wafer substrate 22. The silicon nitride layer 50 has a thickness T1 on the flat area 46, on a region 52 thereof of approximately 8 microns and spaced by a distance 54 of approximately 2 microns from the nearest transistor gate of the transistor gates 34. The silicon nitride layer 50 has a thickness T2 in a base of the low region 38. The $NH_3$ gas and the $SiH_4$ gas flow simultaneously for an equal length of time, so that the resulting partial pressure of $NH_3$ gas to $SiH_4$ gas are in an identical ratio to their respective flow rates. A flow rate ratio of the $NH_3$ gas to the $SiH_4$ gas is selected sufficiently high so that a rate at which the silicon nitride layer forms on the flat area 46 does not differ much from a rate at which the silicon nitride layer forms in a base of the low region 38, and, accordingly, that the resulting thickness T1 is not much thicker than the thickness T2.

FIG. 4 illustrates experimental results of silicon nitride layers that were formed on wafer substrates such as the wafer substrate 22 of FIG. 1. In each case, a processing pressure within the chamber was maintained at approximately 240 Torr. Four wafers were processed at 725° C., and the partial pressure ratio of $NH_3$ gas to $SiH_4$ was changed for each one of the wafers processed at 725° C. Four wafers were then processed at 750° C., each at a different partial pressure ratio of $NH_3$ gas to $SiH_4$ gas, followed by four wafers at 775° C. and four wafers at 800° C. It was found that in each case, the thickness T1 was greater than the thickness T2 by a certain percentage, presented by F(t.v.) (%)=(T1−T2)/T2. F(t.v.) had an optimum minimum at a particular partial pressure ratio of $NH_3$ gas to $SiH_4$ gas. The optimum minimum differed from temperature to temperature. It can generally be said that all the optima fell at a partial pressure ratio of between 200 and 350, regardless of temperature. F(t.v.) was usually also less than 25% at a partial pressure ratio of between 250 and 310. In certain instances, it was also possible to obtain an F(t.v.) of below 20%. An F(t.v.) value below 20% is exceptional because of the given processing conditions, in particular the relatively high pressure.

It may be possible to modify the processing conditions without departing from the scope of the invention. It may, for example, be possible to utilize a temperature in the range of from 600° C. to 850° C., more preferably in the range of from 725° C. to 800° C. as for the sixteen wafers of FIG. 4. The temperature is preferably at least 500° C. in order to obtain a relatively high rate of formation of the silicon nitride layers, as is required for processing a single wafer at a time. It may also be possible to obtain suitable results at a pressure other than 240 Torr. As such, the pressure may be between 50 Torr and 350 Torr, and is preferably at least 100 Torr. It may also be possible to obtain suitable results utilizing different partial pressure ratios of $NH_3$ gas to $SiH_4$ gas. A partial pressure ratio of at least 100 may prove to be suitable at different temperatures and/or pressures. It may also be possible to utilize a different silicon-containing gas such as $Si_2H_6$, $SiH_2Cl_2$, $Si_2Cl_6$, Bis (tert-butylamino)silane (BTBAS), or a combination of these gases, and alter processing conditions accordingly.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of forming a silicon nitride layer on a substrate, comprising:

inserting a substrate having a surface with raised transistor gates and low regions between the transistor gates into a processing chamber;

heating the substrate to a processing temperature of at least 500° C.;

maintaining the pressure within the chamber at a processing pressure of at least 50 Torr;

introducing $NH_3$ gas into the chamber;

introducing a silicon-containing gas into the chamber, a partial pressure ratio of the $NH_3$ gas to the silicon-containing gas being at a selected processing ratio, the silicon-containing gas and the $NH_3$ gas reacting with one another to form a silicon nitride layer on the surface, the processing ratio being selected sufficiently high so that, should the surface have a low region between transistor gates which is less than 0.15 microns wide with a height-to-width ratio of at least 1.0 as well as a substantially flat area, the layer forms at a rate of not more than 25% faster on the flat area than on a base of the low region while the substrate in the chamber is at the processing temperature and the pressure within the chamber is at the processing pressure; and removing the substrate from the chamber.

2. The method of claim 1, wherein the substantially flat area is at least 1 micron square.

3. The method of claim 2, wherein the layer forms at a rate of not more than 25% faster on a region of the flat area which is at least 1 micron away from a nearest transistor gate between the region of the flat area and the low region.

4. The method of claim 1, wherein the processing temperature is between 600° C. and 800° C.

5. The method of claim 1, wherein the processing pressure is between 50 Torr and 350 Torr.

6. The method of claim 1, wherein the silicon-containing gas is at least one of $SiH_4$, $Si_2H_6$, $SiH_2Cl_2$, $Si_2Cl_6$, and BTBAS.

7. The method of claim 6, wherein the surface has a low region which is less than 0.15 microns wide with a height-to-width ratio of at least 1.0, as well as a substantially flat area of at least 25 microns square, the layer forming at a rate of not more than 25% faster on the flat area than in a base of the low region.

8. The method of claim 6, wherein the processing temperature is between 600° C. and 800° C.

9. The method of claim 6, wherein the processing pressure is between 50 Torr and 350 Torr.

10. The method of claim 6, wherein the processing ratio is at least 100.

11. The method of claim 10, wherein the processing ratio is between 200 and 350.

12. The method of claim 11, wherein the processing temperature is between 600° C. and 800° C.

13. The method of claim 12, wherein the processing pressure is between 50 Torr and 350 Torr.

14. The method of claim 13, wherein the pressure is approximately 240 Torr.

* * * * *